US009696386B2

(12) United States Patent
Mercadal et al.

(10) Patent No.: US 9,696,386 B2
(45) Date of Patent: Jul. 4, 2017

(54) SYSTEM AND METHOD OF MAKING AN INTEGRITY TEST ON AN ELECTRICITY NETWORK IN AN AIRCRAFT

(71) Applicant: AIRBUS OPERATIONS (S.A.S.), Toulouse (FR)

(72) Inventors: Hervé Mercadal, Pujaudran (FR); Serge Boyer, Deyme (FR); Henri Treil, Toulouse (FR)

(73) Assignee: Airbus Operations (S.A.S.), Toulouse (FR)

( * ) Notice: Subject to any disclaimer, the term of this patent is extended or adjusted under 35 U.S.C. 154(b) by 380 days.

(21) Appl. No.: 14/275,263

(22) Filed: May 12, 2014

(65) Prior Publication Data
US 2014/0340111 A1 Nov. 20, 2014

(30) Foreign Application Priority Data

May 14, 2013 (FR) ..................................... 13 54289

(51) Int. Cl.
*G01R 31/40* (2014.01)
*G01R 31/00* (2006.01)
(Continued)

(52) U.S. Cl.
CPC ................ *G01R 31/40* (2013.01); *B64F 5/60* (2017.01); *G01R 31/008* (2013.01); *G01R 19/2513* (2013.01); *G01R 31/026* (2013.01)

(58) Field of Classification Search
CPC G01R 19/2513; G01R 19/0092; G01R 31/40; G01R 31/42; G01R 31/025; G01R 31/00; G01R 31/3275
(Continued)

(56) References Cited

U.S. PATENT DOCUMENTS 5,521,787 A * 5/1996 Baker ...................... H02H 3/34
361/113
6,122,575 A * 9/2000 Schmidt .............. G06F 11/2252
244/1 R
(Continued)

FOREIGN PATENT DOCUMENTS

EP 2 199 812 A1 12/2009
EP 2 309 279 A1 10/2010

OTHER PUBLICATIONS

French Search Report for Application No. 1354289 dated Jan. 27, 2014.

*Primary Examiner* — Giovanni Astacio-Oquendo
(74) *Attorney, Agent, or Firm* — Jenkins, Wilson, Taylor & Hunt, P.A.

(57) ABSTRACT

A system and method to test integrity of an electricity power supply network in an aircraft is disclosed. The system comprises: a current injector for connection to an output point of one or more phase line forming a test circuit with an electricity generator, the current injector configured to inject a test signal through the electricity generator in the test circuit; a current measurement test probe for installation in the test circuit to measure intensity of the injected test signal current; and a processing unit to connect to the current measurement test probe and to a set of input and output current measurement probes associated with the phase line to acquire current intensity measurement signals output by the current measurement test probe and by the set of input and output current measurement probes, and to determine electricity indicators representative of the integrity of the electricity power supply network.

9 Claims, 4 Drawing Sheets

(51) Int. Cl.
*B64F 5/60* (2017.01)
*G01R 19/25* (2006.01)
*G01R 31/02* (2006.01)

(58) Field of Classification Search
USPC .................................. 324/764.01, 500, 537
See application file for complete search history.

(56) References Cited

U.S. PATENT DOCUMENTS

| | | | | |
|---|---|---|---|---|
| 6,850,426 | B2* | 2/2005 | Kojori | H02P 23/0004 363/123 |
| 7,099,165 | B1* | 8/2006 | Rozman | H02M 7/53871 363/39 |
| 7,612,514 | B2* | 11/2009 | Anghel | H02J 4/00 318/440 |
| 8,583,388 | B2* | 11/2013 | Yaguchi | G06F 17/5036 324/600 |
| 2003/0016028 | A1* | 1/2003 | Bass | F16L 53/007 324/642 |
| 2006/0097741 | A1* | 5/2006 | Payman | G01R 27/205 324/762.03 |
| 2006/0181271 | A1* | 8/2006 | Lescourret | F41G 3/225 324/207.17 |
| 2008/0084201 | A1 | 4/2008 | Kojori | |
| 2011/0080176 | A1 | 4/2011 | Hopdjanian et al. | |

* cited by examiner

SYSTEM AND METHOD OF MAKING AN INTEGRITY TEST ON AN ELECTRICITY NETWORK IN AN AIRCRAFT

TECHNICAL FIELD

This invention relates to the general manner of checking an electricity power supply network in an aircraft and more particularly checking the network integrity.

BACKGROUND

Aircraft have an increasing need for electrical energy to supply power to the many onboard actuators and electrical equipment. Thus, an aircraft comprises at least one electricity power supply network comprising at least one multi-phase electricity generator supplying power to a plurality of phase lines.

For example, an aircraft may comprise two completely independent AC electricity networks and two DC networks. Each AC network is multi-phase (for example three-phase) with variable or fixed frequency provided by at least one generator coupled to the accessory box of the corresponding engine.

The electrical energy output by the electricity generators integrated into the aircraft engines is routed to the avionics bay through many long cables. Each phase line is shared between several transmission cables to satisfy aeronautical needs that are increasingly dictated by particularly severe safety, reliability and redundancy constraints. Each transmission cable is provided with a current transformer to measure the intensity of the current carried by it. The different current intensity measurements are transmitted to an onboard computer that manages the electricity power supply network.

At the moment, unit tests using special tools are performed as the aircraft assembly progresses to test installation of the cables. These tests are very complex to perform and usually consist of measuring cable resistances sequentially and by segment and require a non-negligible time. The tests thus confirm continuity of the wiring and coherence between the different current intensity measurements but cannot test the assignment of lines or the assembled orientation of the different current transformers. Furthermore, before a network installed in an aircraft can be tested, the generator has to be disconnected and at least part of the wiring has to be removed.

Consequently, the purpose of this invention is to correct the above-mentioned disadvantages by disclosing a system to test the integrity of an electricity power supply network in an aircraft that is easy to use, reliable and non-intrusive.

SUMMARY

This purpose is achieved by an integrity testing system adapted to determine the electrical characteristics related to the integrity of an electricity power supply network in an aircraft, the network comprising at least one multi-phase electricity generator supplying power to a plurality of phase lines, in which each phase line comprises a set of electricity transmission cables between an input point and an output point, each phase line being equipped on its input side with an input current measurement probe and each transmission cable being equipped on its output side with an output current measurement probe, the system comprising:

a current injector adapted to be connected to the output point of at least one of the phase lines thus forming a test circuit with the electricity generator, the current injector being configured to inject a test signal through the electricity generator in the test circuit, a current measurement test probe adapted to be installed in the test circuit to measure the intensity of the current of the injected test signal, and a processing unit adapted to be connected firstly to the current measurement test probe and secondly to a set of input and output current measurement probes associated with the at least one phase line, the processing unit being configured to acquire current intensity measurement signals output by the current measurement test probe and by the set of input and output current measurement probes, and to determine electricity indicators representative of the integrity of the electricity power supply network, based on the current intensity measurements.

Thus, the system can be used to quickly, globally and non-intrusively check the integrity of the electricity power supply network in the aircraft.

Advantageously, the current injector is adapted to be connected to the output points of a set of phase lines and the processing unit is adapted to be connected to the input and output current measurement probes associated with the set of phase lines to simultaneously acquire current intensity measurement signals from the set of phase lines.

This provides a means of detecting any interference between the different phases.

Advantageously, the processing unit determines the electricity indicators by calculating the transfer functions relative to the input and output measurement probes and to the measurement test probe.

The electricity indicators include indicators from among the following indicators: an electrical continuity indicator, a transformation ratio and passband indicator for each of the input and output probes and the test probe, a polarity inversion indicator for each of the input and output probes and the test probe, a test circuit impedance indicator and a crosstalk indicator between the different phase lines.

Advantageously, the processing unit is configured so that it can be installed to replace an onboard aircraft electricity network Generator Control Unit.

Thus, the processing unit can easily be connected to the different probes, without reworking any wiring and with no risk of a wiring error.

The input and output probes and the test probe are current transformers, each the current transformer comprising a primary circuit and a secondary circuit, the primary circuits corresponding to the input and output probes are adapted to be coupled to the electricity power supply network, the primary circuit corresponding to the test probe is adapted to be coupled to the test circuit, and the secondary circuits of the input and output probes and the test probe are adapted to be connected to the processing unit.

The invention also aims at a method of testing the integrity of an electricity power supply network in an aircraft, the network comprising at least one multi-phase electricity generator supplying power to a plurality of phase lines in which each phase line comprises a set of electricity transmission cables between an input point and an output point, each phase line being equipped on the input side with an input current measurement probe and each transmission cable being equipped on its output side with an output current measurement probe, the process comprising the following steps:

injection of a test signal to the output point of at least one of the phase lines, through the electricity generator, measure the intensity of the current of the injected test signal, acquire the measured intensity of the injected test signal current and measurements of current intensities output by a set of input and output current measurement probes associated with the at least one phase line, and determine electricity indicators representative of the integrity of the electricity power supply network, based on the current intensity measurements.

BRIEF DESCRIPTION OF THE DRAWINGS

Other characteristics and advantages of the invention will become clear after reading the preferred embodiment of the invention given as a non-limitative example with reference to the appended figures in which.

DETAILED DESCRIPTION

The basic idea of the invention is to non-intrusively inject a test current through the generator to determine electrical characteristics relative to network integrity.

Figure 1:
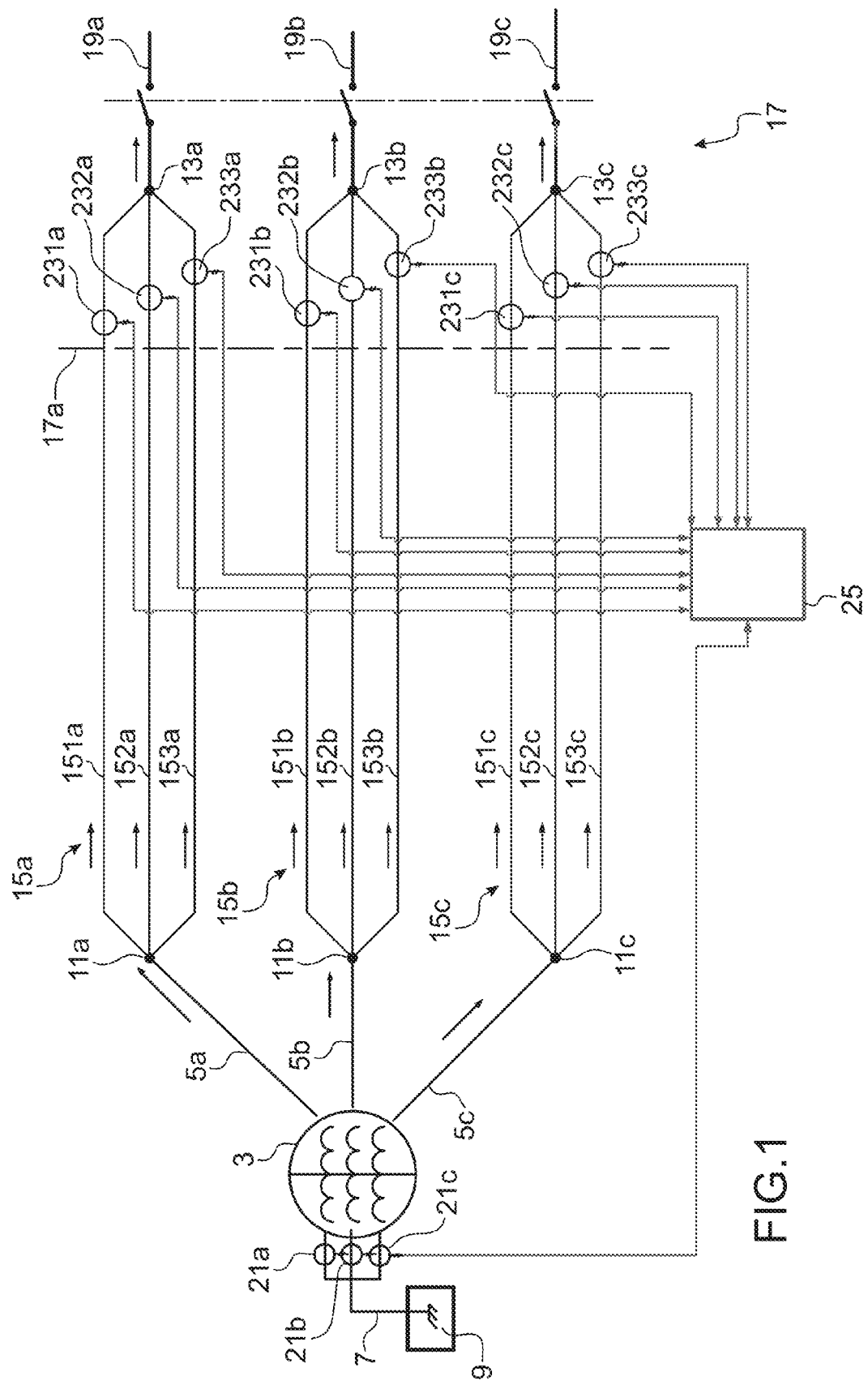
FIG. 1 diagrammatically shows an electricity power supply network in an aircraft.

FIG. 1 diagrammatically shows an electricity power supply network in an aircraft.

The electricity power supply network 1 comprises at least one multi-phase electricity generator 3 supplying power to a plurality of phase lines 5a, 5b, 5c. The example in FIG. 1 shows a three-phase electricity generator 3, the windings of which are star-coupled powering firstly three phase lines 5a-5c and secondly a neutral line 7 connected to the structure 9 of the aircraft (i.e., the ground). Each phase line 5a-5c comprises a set of electricity transmission cables 15a, 15b, 15c between an input point 11a, 11b, 11c located on the end of the generator 3 and an output point 13a, 13b, 13c located in the electricity supply avionics bay. Each set of cables 15a, 15b, 15c comprises at least one cable 151a-153a, 151b-153b, 151c-153c (three cables are shown in the example in FIG. 1). Sharing of each phase line 5a-5c into several cables 151a-153a, 151b-153b, 151c-153c divides the current intensity for reasons of temperature safety and segregation. For example, if a cable is defective, electrical power can always be supplied through the other cables.

More precisely, the output points 13a-13c are located in the PEPDC (Primary Electrical Power Distribution Center) also called the "electrical core of the aircraft" 17 delimited by the dashed line 17a. All cables from electricity generators converge in this electricity core 17 that for a conventional aircraft is located a few tens of meters (40m to 70m) from the engine pods in which generators are located. Cables 151a-153a, 151b-153b, 151c-153c of each set 15a, 15b, 15c are recombined at output points 13a-13c to reform the corresponding phase lines 5a, 5b, 5c that will route the electricity power supply to the distribution cabinet (not shown) under the control of the generator line contactors 19a, 19b, 19c. The distribution cabinet then distributes energy to the electrical control actuators and the different electrical equipment (screens, heating, etc) onboard the aircraft.

Furthermore, each phase line 5a-5c is equipped with an input current measurement probe 21a-21c on its 11a-11c input point end. More particularly, the example in FIG. 1 shows that each winding or phase of the generator 3 is equipped with an input measurement probe 21a-21c on the neutral line end. Furthermore, each transmission cable 151a-153a, 151b-153b, 151c-153c is equipped with an output current measurement probe 231a-233a, 231b-233b, 231c-233c on its 13a-13c output point end. An input or output current measurement probe is normally composed of a current transformer that will measure the intensity of the AC current in the phase line or the transmission cable.

In general, a current transformer is in the form of a torus comprising a primary circuit or winding connected to the cable in which the current to be measured circulates and a secondary measurement circuit or winding dividing the value of the current to be measured by a constant factor. Advantageously, the torus may simply be placed around the conducting line (transmission cable or phase line) and in this case the conducting line forms the primary circuit. In all cases, the current transformer is characterised by its transformation ratio between the intensity of the primary current and the intensity of the secondary current, for example expressed in the form 1000 A/1 A.

Furthermore, the electricity power supply network 1 comprises an onboard Generator Control Unit 25 located in the avionics bay close to the electrical core 17. The GCU (Generator Control Unit) 25 is connected to all current measurement probes 21a-21c, 231a-233c to acquire the different measurements in order to control, regulate and protect the electricity generator 3. More generally, the Generator Control Unit 25 acquires several physical parameters (for example temperatures) when it is in operation, in addition to all electricity measurements in order to control the generator 3 and protect the electricity power supply network 1.

Figure 2:
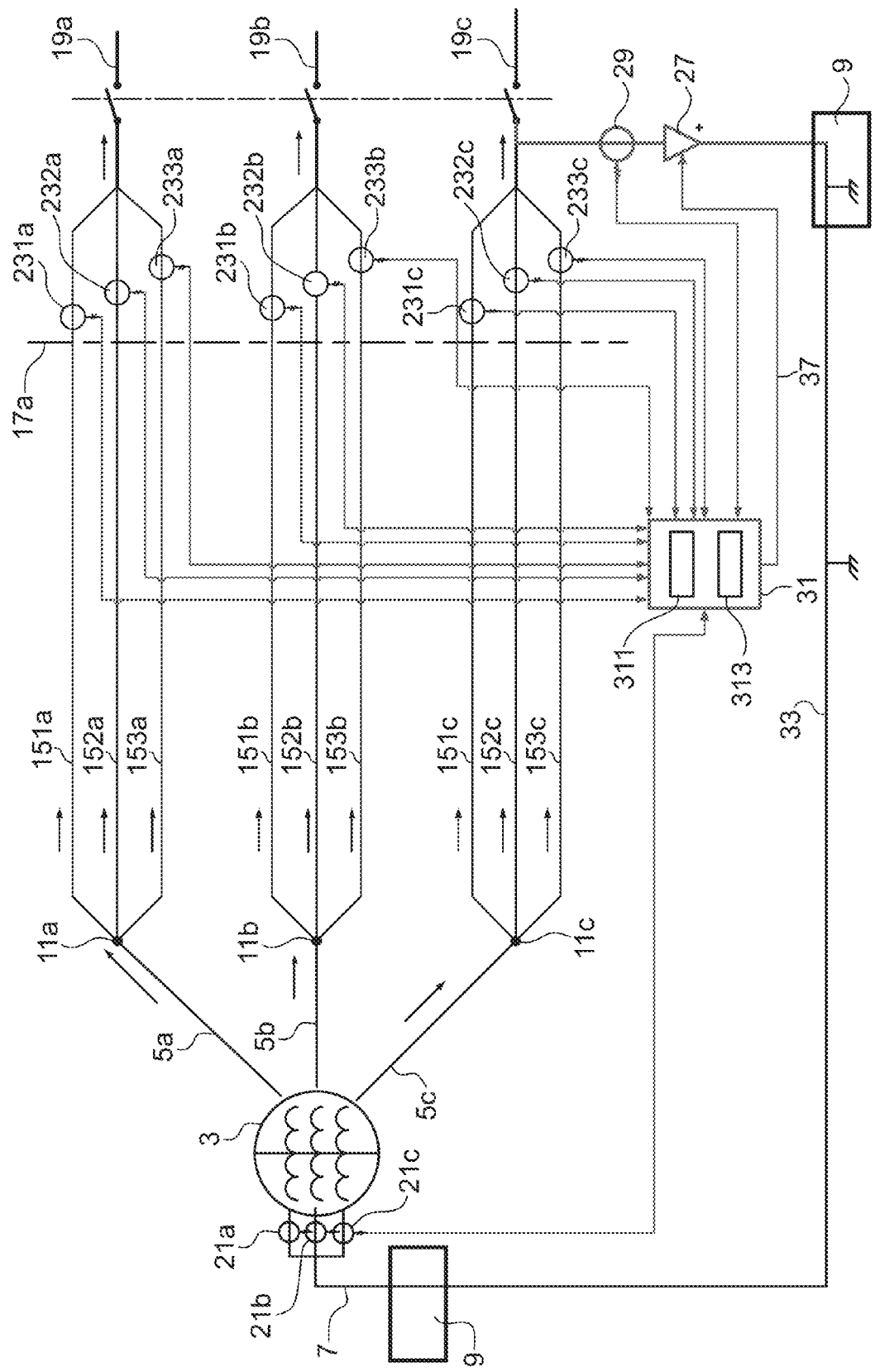
FIG. 2 diagrammatically shows a system for testing the integrity of an electricity power supply network in an aircraft according to one embodiment of the invention.

FIG. 2 diagrammatically shows a system (or a method) for testing the integrity of the electricity power supply network in an aircraft, according to one embodiment of the invention.

According to the invention, the integrity test system comprises a current injector 27, a current measurement test probe 29 and a processing unit 31.

The current injector 27 is adapted to be connected to the output point 19a-19c of at least one of the phase lines 5a-5c for example through a clip that thus requires no disassembly, screwing or unscrewing of bolts. More particularly, the current injector 27 is connected by wire 33 between firstly the output point(s) 19a-19c of one of the phase lines 5a-5c and secondly the neutral of the electricity generator 3 or through the structure 9 of the aircraft that acts as ground, thus forming a test circuit 35 with the electricity generator 3, the GLC contactors 19a-19c of the lines obviously being open.

For example, the current injector 27 may be a current generator or a current amplifier configured to inject a test signal in the test circuit 35 through the electricity generator 3. The injected current intensity is relatively low, approximately of the order of 5% of the intensity of the nominal current of the generator 3. This current can be varied sufficiently so that a precise diagnostic can be made without introducing any risk of damage due to temperature or other destructive risks. The current intensity of the test signal is low level but on the other hand the test signal has the same frequency shape as the high intensity operational signal output by the electricity generator 3 in operation. The test signal checks the architecture and integrity of the electricity network 1 and tests the entire system from the generator 3 as far as the different measurement probes 21a-21c, 231a-233c, and 29.

For example, the test signal is of the order of 20 A and the frequency is between 0 Hz and 20 kHz for a nominal operational current intensity of 400 A to 450 A. Advantageously, the integrity test is carried out at very low voltage (less than 50V) and preferably of the order of 20V so that work can be done in complete safety.

The current measurement test probe 29 is adapted so that it can be installed in the test circuit 35 to measure the intensity of the injected test signal current. The measurement test probe 35 is for example of the current transformer type the primary circuit of which is connected or coupled to the test circuit 35 in which the test signal to be measured circulates and the secondary circuit of which divides the intensity of the test signal to be measured by a constant factor (for example a factor of 1000).

The processing unit 31 is adapted so that it can be connected firstly to the current measurement test probe 29 and secondly to a set of input 21a-21c and output 231a-233c current measurement probes associated with at least one phase line 5a-5c (in the example in FIG. 2, the processing unit 31 is connected to the input probe 21c and the output probes 233a-233c associated with the phase line 5c). More precisely, the secondary circuits of the current transformers corresponding to the input and output probes 21a-21c, 231a-233c and the test probe 29 are connected to the processing unit 31.

Furthermore, the processing unit 31 is adapted to be connected to the current injector 27 to control the amplitude and frequency of the injected signal. More particularly, the processing unit 31 is configured to control the current injector 27 through a control link 37 for example to apply a sinusoidal scan of the current intensity and the frequency of the test signal injected into the test circuit 35. Thus, the processing unit 31 regulates the intensity of the injected current knowing that the response of the current injector 27 is not necessarily linear.

Furthermore, the processing unit 31 comprises an acquisition module 311 configured to acquire current intensity measurement signals output by the current measurement test probe 29 and by the set of input and output current measurement probes 21a-21c, 231a-233c connected to the processing unit 31. The processing unit 31 also comprises a calculation module 313 configured to make signal processing based on current intensity measurements in order to determine electricity indicators representative of the integrity of the electricity power supply network 1.

The integrity of the network is characterised essentially by the validity of the nodes law. Thus, for an n-phase electricity generator, the complex current intensity Igen_i measured by an input probe in a phase line i∈{1, 2, . . . n} must be equal to the sum of the complex current intensities Iline_i_m (measured by the input probes) in the set p∈{1, 2, . . . m} of m electricity transmission cables corresponding to phase line i according to the following expression:

$$\overline{\text{Igen\_i}} = \sum_{p=1}^{m} \overline{\text{Iline\_i\_p}}$$

More particularly, the processing unit 31 determines electricity indicators by calculating transfer functions related to the input and output probes 21a-21c, 231a-233c and to the measurement test probe 29. The transfer function of a measurement probe represents the relation between the input signal (i.e., the signal in the primary circuit) and the output signal (i.e. the signal in the secondary circuit) of the probe considered as being an invariable linear system. A graphic resolution of the transfer function may be made using a Bode diagram representing the frequency behaviour of the probe. In a known manner, the Bode diagram is composed of a first plot of the gain in decibels as a function of the frequency and a second plot of the phase in degree as a function of the frequency. These plots can quickly and visually display gain and phase margins, the continuous gain, the passband and the stability of the probe. Thus, by comparing the Bode diagrams constructed from measurements observed by the probes with reference to Bode diagrams, the processing unit 31 can quickly detect the slightest anomaly. In particular, by injecting current through the coil of the electricity generator 3, the processing unit 31 can verify the power circuit (or test circuit 35) and the associated measurement circuits in a single test.

Advantageously, electricity indicators determined from transfer functions comprise an electrical continuity indicator, a transformation ratio and passband indicator for each measurement probe 21a-21c, 231a-233c, 29, a polarity inversion indicator for each probe 21a-21c, 231a-233c, 29, and an impedance indicator for the test circuit 35 and therefore the network.

The electrical continuity indicator is identified by the electrical resistance that detects electrical continuity of the different cables 151a-153c and phase lines 5a-5c and the electrical continuity of secondary circuits. For example, a discontinuity due to a badly tightened bolt or an oxidised lug can be detected immediately while identifying the cable concerned. Then, the distance between the current injection point and the location of the fault in the defective cable can be determined using a known reflectometry technique.

The transformation ratio and passband indicator for each measurement probe 21a-21c, 231a-233c, 29 is directly identified by Bode diagrams. This indicator verifies that the response (gain or ratio) of each probe is correct over a determined frequency range. This means that any leak in the winding or damage to a probe core can be detected. Furthermore, if a transformation ratio for a given probe is zero, it can be deduced that the probe in question is not wired.

More generally, for a current density Iinj_i injected at the output point of a phase line i, the transformation ratio and the wiring and polarity of the measurements will be deemed to be correct if the following relations are satisfied:

$$\begin{cases} \forall\, i \text{ and } \forall\, p: \dfrac{\overline{\text{Iline\_i\_p}}}{\overline{\text{Iinj\_i}}} = \overline{G} \\ \text{and} \\ \forall\, i: \dfrac{\overline{\text{Igen\_i}}}{\overline{\text{Iinj\_i}}} = \overline{G} \end{cases}$$

where $\overline{G}$ represents the gain or the theoretical transformation ratio of the current transformers.

In particular, the polarity inversion indicator is identified by the measurement of the phase angle. Thus, a wrong installation or bad orientation of a measurement probe is immediately detected by the observation of phase opposition between the probe primary and secondary circuits.

The impedance indicator is identified by the impedance measurement or by detection of an unbalance in the current intensity between the cables 151a-153c. More precisely, the complex impedance matrix $\overline{Z}$ in a system composed of n phases is defined as follows:

$$\begin{pmatrix} \left(\frac{\overline{V_{1\_1}}}{\overline{I_{inj\_1}}}\right) & \cdots & \left(\frac{\overline{V_{n\_1}}}{\overline{I_{inj\_1}}}\right) \\ \vdots & \ddots & \vdots \\ \left(\frac{\overline{V_{1\_n}}}{\overline{I_{inj\_n}}}\right) & \cdots & \left(\frac{\overline{V_{n\_n}}}{\overline{I_{inj\_n}}}\right) \end{pmatrix}$$

Thus, a damaged, loose or grounded cable will have higher impedance than the others and consequently can be detected immediately due to the impedance indicator.

Advantageously, the current injector 27 is connected to the output points 13a-13c of a set of phase lines 5a-5c and the processing unit 31 is connected to the output current measurement probes 231a-233c fitted on the transmission cables 151a-153c belonging to this set of phase lines. Thus, the processing unit 31 may simultaneously acquire current intensity measurement signals from the set of phase lines 5a-5c. For example, the current injector 27 may be connected to output points 13a-13c of all phase lines 5a-5c and the processing unit 31 is connected to the measurement probes 21a-21c, 231a-233c associated with all phase lines 5a-5c. Thus, the processing unit 31 determines a crosstalk indicator (in gain and in phase) between different phase lines or between all phase lines, detecting any interference between the different phases.

It will be noted that the crosstalk $\overline{Diaph\_j\_vs\_i}$ between two different phase lines i and j for a transmission cable p can be measured according to the following transfer functions:

$$\begin{cases} \forall i \neq j, \overline{Diaph\_J\_vs\_i} = \frac{\overline{I_{gen\_J}}}{\overline{I_{inj\_i}}} \\ \overline{Diaph\_J\_vs\_i} = \frac{\overline{line\_J\_p}}{\overline{I_{inj\_i}}} \end{cases}$$

Advantageously, the processing unit 31 is configured so that it can be installed to replace the onboard Generator Control Unit 25 for controlling the electricity network 1 to which connections from the different measurement probes are fitted (see FIG. 1).

Thus, all that is necessary to make the test is to remove the Generator Control Unit 25 (that is installed in the avionics bay) and replace it by the processing unit 31 making the same connections to the different probes without any risk of wiring error.

Figure 3:
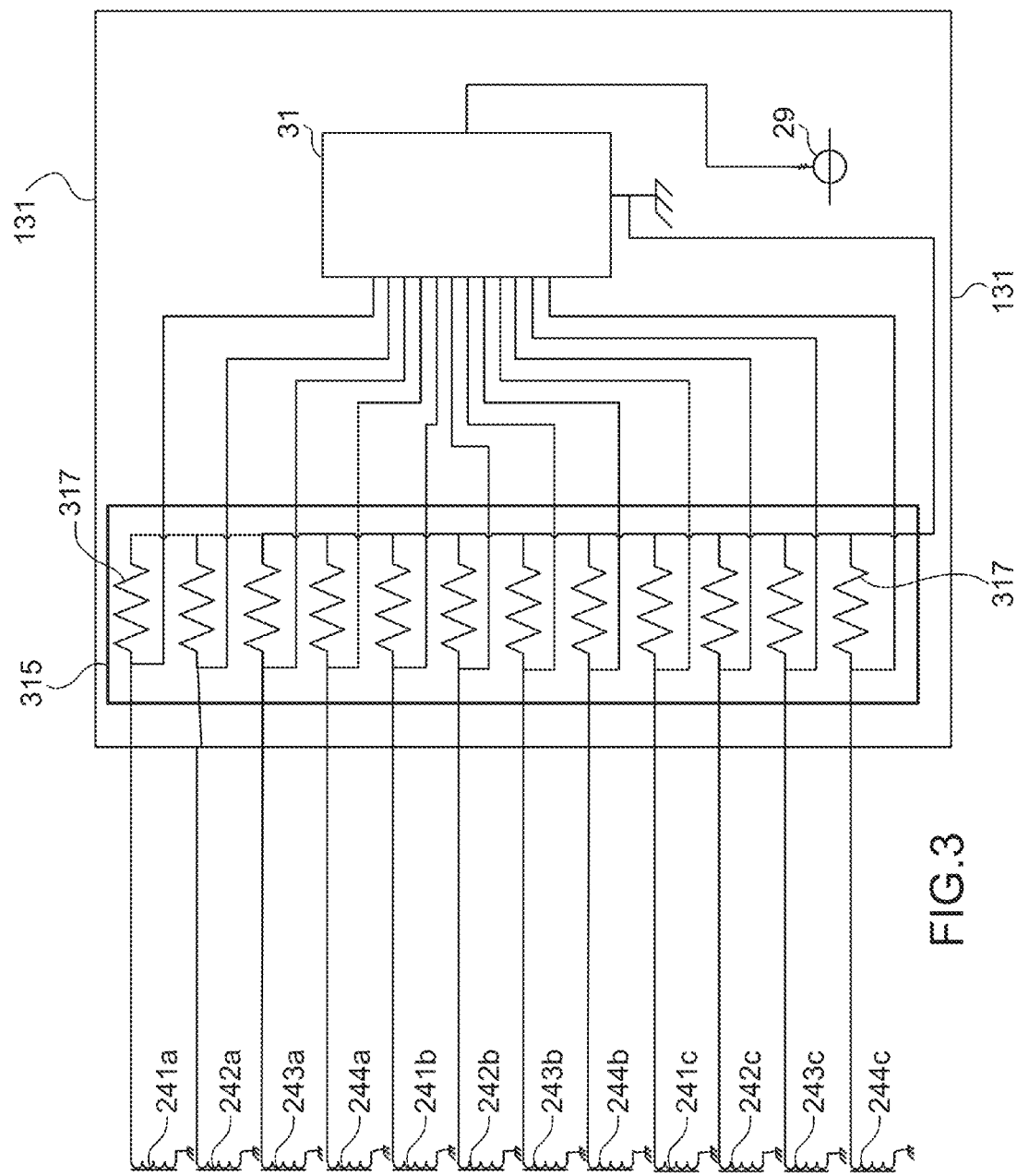
FIG. 3 diagrammatically shows connections of the different probes to the processing unit of the integrity testing system according to one embodiment of the invention.

FIG. 3 diagrammatically shows connections of the different probes to the processing unit of the integrity test system according to one embodiment of the invention.

According to this example, the processing unit 31 is included in a processing device 131 comprising an input module 315. This input module comprises load resistances 317 to transform current intensity measurements output from the secondary circuits 241a-244c of the different probes 21a-21c, 231a-233c into corresponding voltage measurements. This shapes the analogue signals before they are digitally processed.

Figure 4:
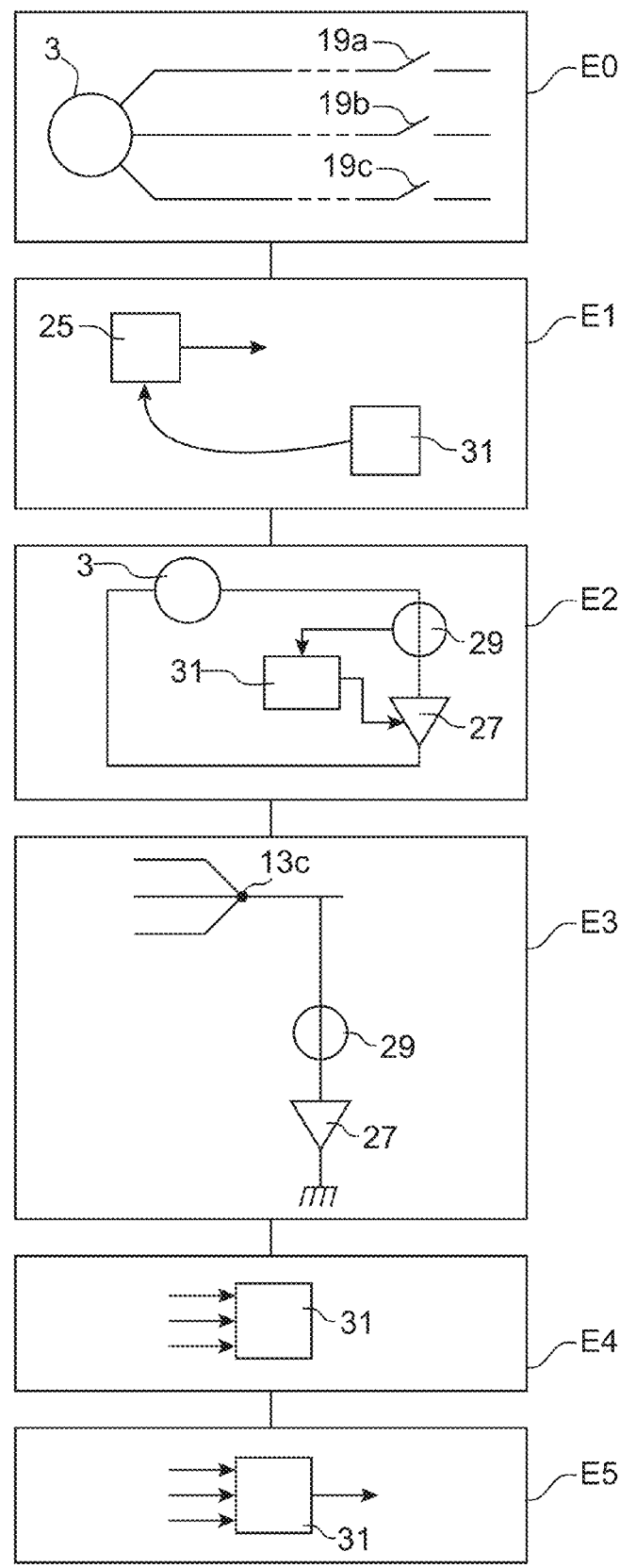
FIG. 4 diagrammatically shows a process for testing the integrity of an electricity power supply network in an aircraft according to one embodiment of the invention.

FIG. 4 diagrammatically shows a method for testing the integrity of an electricity power supply network in an aircraft according to one embodiment of the invention.

In step E0, the electricity generator 3 is switched off and the line contactors 19a-19c GLC are open.

In step E1, the Generator Control Unit 25 is removed and is replaced by the processing unit 31. Thus the processing unit 31 is adapted to receive connections from the different input and output measurement probes 21a-21c, 231a-233c directly.

In step E2, the current injector 27 (for example a current amplifier) is connected firstly to an output point 13a-13c from at least one of the phase lines 5a-5c by a crocodile clip and secondly to the neutral of the generator 3 through the structure 9 of the aircraft thus forming the test circuit 35 with the electricity generator 3. Furthermore, a measurement test probe 29 is installed in the test circuit 35 and its secondary measurement circuit is connected to the processing unit 31. Furthermore, the processing unit 31 is connected to the current injector 27 through a control link 37 so that the processing unit 31 can control the current injector.

In step E3, a test signal is injected at the output point 13a-13c of at least one of the phase lines 5a-5c. The current injector 27 injects the test signal through the electricity generator 3 under the control of the processing unit 31. The current intensity of the injected test signal is measured by the measurement test probe 29 and is transmitted to the processing unit 31.

Step E4 concerns acquisition of the measurement of the intensity of the injected test signal current and measurements of current intensities output by all input and output current measurement probes 21a-21c, 231a-233c associated with the phase line(s) 5a-5c concerned by the test.

In step E5, the processing unit 31 determines electricity indicators representative of the integrity of the electricity power supply network, based on current intensity measurements.

This test method thus provides a global, fast and non-intrusive method of checking the integrity of the electricity power supply network 1 on the input side of contactors 19a-19c.

The invention claimed is:

1. An integrity testing system adapted to determine electrical characteristics related to an integrity of an electricity power supply network in an aircraft, the electricity power supply network comprising at least one multi-phase electricity generator supplying power to a plurality of phase lines in which each phase line comprises a set of electricity transmission cables between an input point located on an end of the at least one multi-phase electricity generator and an output point, each phase line being equipped on its input side with an input current measurement probe and each transmission cable being equipped on its output side with an output current measurement probe, the integrity testing system comprising:

a current injector adapted to be connected to the output point of at least one of the plurality of phase lines and a ground node shared with the at least one multi-phase electricity generator, thus forming a test circuit with the at least one multi-phase electricity generator, the current injector being configured to inject a test signal through the at least one multi-phase electricity generator in the test circuit;

a current measurement test probe adapted to be installed in the test circuit to measure an intensity of the current of the injected test signal; and a processing unit adapted to be connected firstly to the current measurement test probe and secondly to a first set of input and output current measurement probes associated with the at least one phase line, the processing unit being configured to acquire current intensity measurement signals output by the current measurement test probe and by the first set of input and output current measurement probes, and to determine electricity indicators representative of the integrity of the electricity power supply network, by performing signal processing based on the current intensity measurement signals.

2. The integrity testing system according to claim 1, wherein the current injector is adapted to be connected to the output points of a set of phase lines and the processing unit is adapted to be connected to the input and output current measurement probes associated with the set of phase lines to simultaneously acquire current intensity measurement signals from the set of phase lines.

3. The integrity testing system according to claim 1, wherein the processing unit is configured to determine the electricity indicators by calculating transfer functions relative to the input and output measurement probes and to the measurement test probe.

4. The integrity testing system according to claim 3, wherein the electricity indicators include indicators from among the following indicators: an electrical continuity indicator, a transformation ratio and passband indicator for each of the input and output probes and the test probe, a polarity inversion indicator for each of the input and output probes and the test probe, a test circuit impedance indicator and a crosstalk indicator between the different phase lines.

5. The integrity testing system according to claim 1, wherein the processing unit is configured so that it can be installed to replace an onboard aircraft electricity network Generator Control Unit.

6. The integrity testing system according to claim 1, wherein the input and output probes and the test probe are current transformers, each the current transformer comprising a primary circuit and a secondary circuit, the primary circuits corresponding to the input and output probes are adapted to be coupled to the electricity power supply network, the primary circuit corresponding to the test probe is adapted to be coupled to the test circuit, and the secondary circuits of the input and output probes and the test probe are adapted to be connected to the processing unit.

7. The integrity testing system according to claim 1, wherein the injected test signal has a same frequency shape as a high intensity operational signal output by the at least one multi-phase electricity generator, and wherein the injected test signal has a current intensity that is low relative to the high intensity operational signal.

8. A method of testing an integrity of an electricity power supply network in an aircraft, the electricity power supply network comprising at least one multi-phase electricity generator supplying power to a plurality of phase lines in which each phase line comprises a set of electricity transmission cables between an input point located on an end of the at least one multi-phase electricity generator and an output point, each phase line being equipped on the input side with an input current measurement probe and each transmission cable being equipped on its output side with an output current measurement probe, the process comprising:

injecting a test signal to the output point of at least one of the plurality of phase lines, through the at least one multi-phase electricity generator and from the output point to a ground node shared with the at least one multi-phase electricity generator;

measuring intensity of a current of the injected test signal;

acquiring the measured intensity of the injected test signal current and measurements of current intensities output by a first set of input and output current measurement probes associated with the at least one of the plurality of phase lines; and determining electricity indicators representative of the integrity of the electricity power supply network by performing signal processing based on the measurements of current intensities.

9. The method of claim 8, wherein the injected test signal has a same frequency shape as a high intensity operational signal output by the at least one multi-phase electricity generator, and wherein the injected test signal has a current intensity that is low relative to the high intensity operational signal.

* * * * *